(12) United States Patent
Kosel et al.

(10) Patent No.: US 11,317,193 B2
(45) Date of Patent: Apr. 26, 2022

(54) MECHANICAL FREQUENCY UPCONVERTER

(71) Applicant: KING ABDULLAH UNIVERSITY OF SCIENCE AND TECHNOLOGY, Thuwal (SA)

(72) Inventors: Jürgen Kosel, Thuwal (SA); Abdullah Saud Almansouri, Thuwal (SA)

(73) Assignee: KING ABDULLAH UNIVERSITY OF SCIENCE AND TECHNOLOGY, Thuwal (SA)

(*) Notice: Subject to any disclaimer, the term of this patent is extended or adjusted under 35 U.S.C. 154(b) by 0 days.

(21) Appl. No.: 17/043,180

(22) PCT Filed: Apr. 4, 2019

(86) PCT No.: PCT/IB2019/052771
§ 371 (c)(1),
(2) Date: Sep. 29, 2020

(87) PCT Pub. No.: WO2019/197950
PCT Pub. Date: Oct. 17, 2019

(65) Prior Publication Data
US 2021/0144464 A1    May 13, 2021

Related U.S. Application Data

(60) Provisional application No. 62/654,687, filed on Apr. 9, 2018.

(51) Int. Cl.
*H04R 1/24* (2006.01)
*H04R 1/28* (2006.01)
*H03D 7/16* (2006.01)

(52) U.S. Cl.
CPC .......... *H04R 1/24* (2013.01); *H03D 7/16* (2013.01); *H04R 1/2853* (2013.01); *H04R 1/2892* (2013.01)

(58) Field of Classification Search
CPC ...... H04R 1/24; H04R 1/2892; H04R 1/2853; H03D 7/16
See application file for complete search history.

(56) References Cited

U.S. PATENT DOCUMENTS

| | | | |
|---|---|---|---|
| 7,579,757 B2 * | 8/2009 | Kulah | F03G 7/08 310/339 |
| 2016/0245894 A1 * | 8/2016 | Deng | G01S 1/72 |

FOREIGN PATENT DOCUMENTS

| | | |
|---|---|---|
| WO | 2005069959 A2 | 8/2005 |
| WO | 2014037890 A2 | 3/2014 |

OTHER PUBLICATIONS

Ali, Imran, et al., "CMOS-MEMS Multiple Resonant Vibration Energy Harvester for Wireless Sensor Network," 2015 IEEE Regional Symposium on Micro and Nanoelectronics (RSM2015), Aug. 19, 2015, pp. 1-4.

(Continued)

*Primary Examiner* — Sunita Joshi
(74) *Attorney, Agent, or Firm* — Patent Portfolio Builders PLLC

(57) ABSTRACT

A mechanical frequency upconverter includes a body having a cavity. A low-frequency membrane is coupled to the body and arranged adjacent to the cavity. The low-frequency membrane is a permanent magnet or a permanent magnet is affixed to the low-frequency membrane. A high-frequency membrane is coupled to the body and arranged adjacent to the cavity. The high-frequency membrane includes a magnetic metal. Oscillation of the low-frequency membrane at a first frequency causes the high-frequency membrane to oscillate at a second frequency, which is higher than the first frequency.

20 Claims, 3 Drawing Sheets

(56) References Cited

OTHER PUBLICATIONS

De La Torre, P.R., et al., "iSAT: The Mega-Fauna Acoustic Tracking System," 2013 MTS/IEEE Oceans, Jun. 10-14, 2013, IEEE.
De La Torre, P.R., et al., "The Integrated Satellite-Acoustic Telemetry (iSAT) System for Tracking Marine Megafauna," 2012, Oceans, May 21-24, 2012, IEEE.
International Search Report in corresponding/related International Application No. PCT/IB2019/052771, dated Jul. 10, 2019.
Kessel, S.T., et al., "A Review of Detection Range Testing in Aquatic Passive Acoustic Telemetry Studies," Reviews in Fish Biology Fisheries, Oct. 6, 2013, vol. 24, pp. 199-218, Springer.
Kulah, H. et al., "An Electromagnetic Mirco Power Generator for Low-Frequency Environmental Vibrations," 17th IEEE International Conference on Micro Electro Mechanical Systems (MEMS), Piscataway, NJ, USA, Jan. 25-29, 2004, pp. 237-240, IEEE.
Li, H., et al., "An Energy Harvesting Underwater Acoustic Transmitter for Aquatic Animals," Scientific Reports, Sep. 20, 2016, 6:33804, DOI: 10.1038, pp. 1-9.
Scherrer, S.R., et al., "Depth- and Range-Dependent Variation in the Performance of Aquatic Telemetry Systems: Understanding and Predicting the Susceptibility of Acoustic Tag-Receiver Pairs to Close Proximity Detection Interference," Peer J, Jan. 12, 2018, DOI 10.7717, pp. 1-30.
Vemco, V7TP to V16TP-Temp/Depth, Transmitters, downloaded from the internet Apr. 9, 2018 (https://www.oceans-research.com/products/transmitters/sensor-tags/v7tp-v16tp-tempdepth/).
Written Opinion of the International Searching Authority in corresponding/related International Application No. PCT/IB2019/052771, dated Jul. 10, 2019.

\* cited by examiner

MECHANICAL FREQUENCY UPCONVERTER

CROSS-REFERENCE TO RELATED APPLICATIONS

This application is a U.S. National Stage Application of International Application No. PCT/IB2019/052771, filed on Apr. 4, 2019, which claims priority to U.S. Provisional Patent Application No. 62/654,687, filed on Apr. 9, 2018, entitled "A MAGNETO-ACOUSTIC TRACKING TAG," the disclosures of which are incorporated herein by reference in their entirety.

BACKGROUND

Technical Field

Embodiments of the subject matter disclosed herein generally relate to a mechanical frequency upconverter, and more specifically to a mechanical frequency upconverter that operates without an electrical power source.

Discussion of the Background

Marine scientist have used acoustic telemetry for many years to study and understand the spatial ecology, migratory behaviors, and mortality rates of aquatic animals. Initially, acoustic telemetry involved active tracking in which an animal was equipped with an acoustic tag and followed in real-time by a directional hydrophone attached to a boat. Later, passive acoustic telemetry was developed, which involved battery-powered stationary hydrophone stations placed under the water. Data extracted from the hydrophone stations was collected and processed to determine the behaviors of animals.

Development of acoustic tracking tags focuses on minimizing the size and weight of the tag, increasing the operational lifetime of the tag, and increasing the strength of the acoustic signals generated by the tag. Conventionally, there is a trade-off between reducing the size and weight of the tag and increasing the operational lifetime and signal strength of the tag. For example, the smallest tracking tag currently produced by the leading company for passive acoustic telemetry systems, Vemco Ltd., is 11 mm×3.6 mm×5.7 mm and weighs 420 mg in air. This tag, however, has an operational lifetime of only 34 days when operating in pulse position modulation (PPM) mode with a nominal delay of 20 seconds. Another acoustic tracking tag has a length of 15 mm, diameter of 3.38 mm, weighs 217 mg in air and provides approximately 100 days operational time with a nominal delay of 3 seconds. An inspection of this device revealed that the acoustic transmitter occupies 20% of the tag volume and the battery occupied the remaining 80% of the tag volume.

In order to extend the operational lifetime of acoustic tracking tags, a tracking tag with a one year lifetime, when operating with a 15 second nominal delay, has been proposed. The extended operational lifetime resulted in a large device (24.4 mm in length and 5 mm in diameter) that was heavy (720 mg in air). Inspection of the components revealed that the battery occupied approximately 67% of the tracking tag volume, whereas the acoustic transducer occupied approximately 12% of the tracking tag volume. Thus, it will be appreciated that current tracking tag designs must accept a tradeoff of either a smaller size and weight but a short operational lifetime or a larger size and weight with a longer operational lifetime. Increasing the size and weight of the tracking tag makes it less suitable for tracking smaller animals, whereas a decreased size and weight, and thus a shorter operational lifetime, requires more frequent replacement of the tracking tag, which is resource intensive because this must be performed manually.

One attempt to address the operational lifetime was to replace the battery with a long flexible beam that harvests the tagged animal's motion to power the electronics of the tracking tag. This tag, however, has a length of 77 mm and a weight of approximately 1 g in air, which limits this tracking tag to being used only for tracking large animals.

Thus, there is a need for an acoustic tracking tag that is small and light enough to be used to track animals of a variety of sizes, which also provides a long operational lifetime.

SUMMARY

According to an embodiment, there is a mechanical frequency upconverter including a body having a cavity. A low-frequency membrane is coupled to the body and arranged adjacent to the cavity. The low-frequency membrane is a permanent magnet or a permanent magnet is affixed to the low-frequency membrane. A high-frequency membrane is coupled to the body and arranged adjacent to the cavity. The high-frequency membrane includes a magnetic metal. Oscillation of the low-frequency membrane at a first frequency causes the high-frequency membrane to oscillate at a second frequency, which is higher than the first frequency. In some embodiments, the magnetic metal of the high-frequency membrane can be made bistable by local crystallization, which boosts output power of the upconverter.

According to another embodiment, there is an acoustic tracking system comprising an acoustic receiver configured to receive acoustic pulses within predetermined frequency range and a mechanical frequency upconverter affixed to a moveable object. The mechanical frequency upconverter includes a body having a cavity. A low-frequency membrane is coupled to the body and arranged adjacent to the cavity. The low-frequency membrane is a permanent magnet or a permanent magnet is affixed to the low-frequency membrane. A high-frequency membrane is coupled to the body and arranged adjacent to the cavity. The high-frequency membrane includes a magnetic metal. Oscillation of the low-frequency membrane at a first frequency causes the high-frequency membrane to oscillate at a second frequency, which is higher than the first frequency. Oscillation of the high-frequency membrane generates the acoustic pulses at the second frequency, which is within the predetermined frequency range.

According to a further embodiment, there is a method for acoustic tracking. A mechanical frequency upconverter is affixed to a moveable object. The mechanical frequency upconverter includes a body having a cavity. A low-frequency membrane is coupled to the body and arranged adjacent to the cavity. The low-frequency membrane is a permanent magnet or a permanent magnet is affixed to the low-frequency membrane. A high-frequency membrane is coupled to the body and arranged adjacent to the cavity. The high-frequency membrane includes a magnetic metal. Oscillation of the low-frequency membrane at a first frequency causes the high-frequency membrane to oscillate at a second frequency, which is higher than the first frequency. An acoustic receiver receives acoustic pulses generated by the high-frequency membrane due to movement of the moveable object. The movement of the moveable object causes the low-frequency membrane to oscillate, which induces oscillation in the high-frequency membrane.

BRIEF DESCRIPTION OF THE DRAWINGS

The accompanying drawings, which are incorporated in and constitute a part of the specification, illustrate one or more embodiments and, together with the description, explain these embodiments. In the drawings.

DETAILED DESCRIPTION

The following description of the exemplary embodiments refers to the accompanying drawings. The same reference numbers in different drawings identify the same or similar elements. The following detailed description does not limit the invention. Instead, the scope of the invention is defined by the appended claims. The following embodiments are discussed, for simplicity, with regard to the terminology and structure of mechanical frequency upconverter.

Reference throughout the specification to "one embodiment" or "an embodiment" means that a particular feature, structure or characteristic described in connection with an embodiment is included in at least one embodiment of the subject matter disclosed. Thus, the appearance of the phrases "in one embodiment" or "in an embodiment" in various places throughout the specification is not necessarily referring to the same embodiment. Further, the particular features, structures or characteristics may be combined in any suitable manner in one or more embodiments.

Figure 1A:
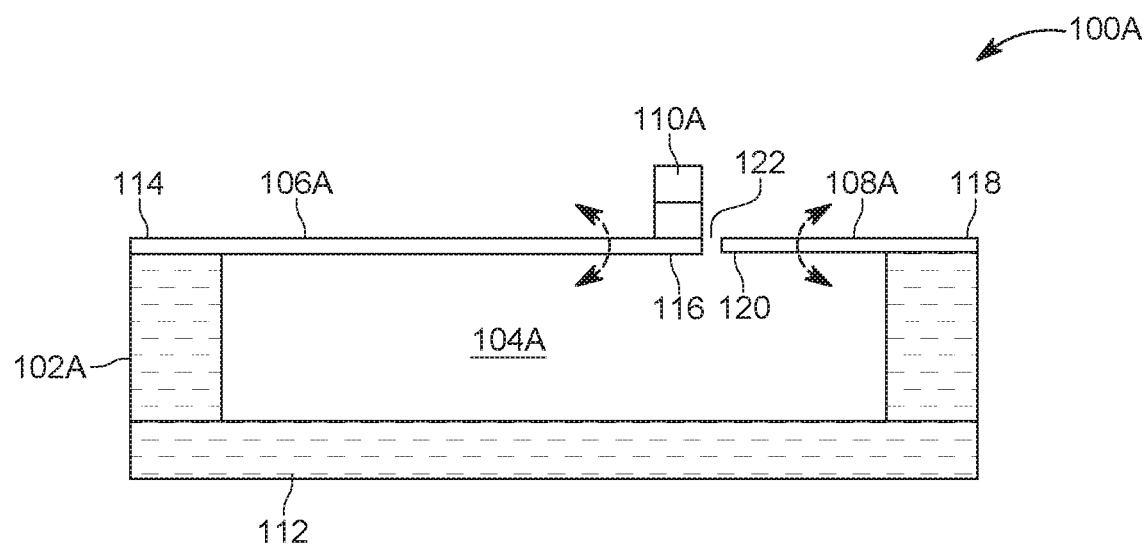
FIG. 1A is a schematic illustration of a side view of a mechanical frequency upconverter according to an embodiment.

FIG. 1A is a schematic illustration of a side view of a mechanical frequency upconverter 100A according to an embodiment. The mechanical frequency upconverter 100A includes a body 102A having a cavity 104A. A low-frequency membrane 106A is coupled to the body 102A and arranged adjacent to the cavity 104A. The low-frequency membrane 106A is a permanent magnet (this configuration is not illustrated in FIG. 1A) or a permanent magnet 110A is affixed to the low-frequency membrane 106A. A high-frequency membrane 108A is coupled to the body 102A and arranged adjacent to the cavity 104A. The high-frequency membrane 108A comprises magnetic metal. Oscillation of the low-frequency membrane 106A at a first frequency causes the high-frequency membrane 108A to oscillate at a second frequency, which is higher than the first frequency. Specifically, when a permanent magnet is employed, oscillation of the permanent magnet 110A in the vertical direction causes the position of the poles of the permanent magnet 110A to change relative to the high-frequency membrane 108A, which due to the magnetic metal in the high-frequency membrane 108A causes the high-frequency membrane 108A to be alternatingly attracted to the opposite poles, and thus to oscillate. Similar oscillation behavior occurs when the low-frequency membrane 106A is a permanent magnet. Accordingly, the mechanical frequency upconverter 100A upconverts the low-frequency oscillations of the low-frequency membrane 106A to higher frequency oscillations of the high-frequency membrane 108A.

The particular resonant frequency of the low frequency membrane 106A and the high-frequency membrane 108A can be selected by suitable selection of the size and materials of the membrane, which can be determined using the following formula:

$$f_0 = \frac{t}{4\pi L^2}\sqrt{\frac{E}{\rho}} \quad (1)$$

where $f_0$ is the fundamental frequency, t is the thickness of the membrane, L is the length of the membrane, E is Young's modulus, and $\rho$ is the density of the membrane material. The stray field of the magnet magnetizes the magnetic material of the high-frequency membrane, which produces an attractive force between the high-frequency membrane and the poles of the permanent magnet, which is represented by the following formula:

$$F = \frac{\mu q_1 q_2}{4\pi r}$$

where F is the attractive force, q is the magnitude of the magnetic pole, $\mu$ is the permeability, and r is the distance between the permanent magnet and the high-frequency membrane. In this bistable system, the high-frequency membrane will always bend toward one of the two poles of the permanent magnet.

In the embodiment illustrated in FIG. 1A, the body 102A includes a base 112 on a first side of the cavity 104A. Further, the low-frequency membrane 106A and the high-frequency membrane 108A both have a cantilever design. Specifically, a first end 114 of the low-frequency membrane 106A is attached to the body 102A on a second side of the cavity 104A, which is opposite of the first side of the cavity 104A. A second end 116 of the low-frequency membrane 106A is not attached to the body 102A. Similarly, a first end 118 of the high-frequency membrane 108A is attached to the body 102A on the second side of the cavity 104A and a second end 120 of the high-frequency membrane 108A is not attached to the body 102A. As, illustrated, the permanent magnet 110A is attached to the second end 116 of the low-frequency membrane 106A. The first ends 114 and 118 of the low-frequency 106A and high-frequency 108A membranes are arranged in a same plane. Further, the second ends 116 and 120 of the low-frequency 106A and high-frequency 108A membranes are separated by a gap 122 in the plane.

The maximum output level of the acoustic signal generated by the mechanical frequency upconverter in FIG. 1A is relatively low. The maximum output level can be boosted by configuring the high-frequency membrane so it has a bistable design in which the high-frequency membrane exists in only two stable states, i.e., a first stable state in which it deflects above the plane at which the first end 118 of the high-frequency membrane 108A is affixed to the body 102A and a second stable state in which it deflects below the plane at which the first end 118 of the high-frequency membrane 108A is affixed to the body 102A. Accordingly, the high-frequency membrane 108A has a double-well restoring force and only resonates once it flips from one stable state to the other, and thus has a broadband performance and oscillates at its resonant frequency as soon as the exciting force from the permanent magnet 110A is higher than the interwell threshold force of the buckled structure.

The high-frequency membrane 108A can be made bistable in a number of different ways. One way this can be achieved is by local crystallization of an amorphous metal by cutting the amorphous metal with a laser. The high temperature causes a local (i.e., only around the cutting area) crystallization of the amorphous metal while leaving the majority of the membrane as amorphous metal. By optimizing laser parameters (i.e., power, frequency, speed, etc.) it is possible to cut and locally anneal the high-frequency membrane in a single step. In one embodiment, a high-frequency membrane produced in this manner achieved a displacement of approximately ±50 μm. By its nature, the crystalline structure has a higher density than the amorphous structure (up to 3% higher), and thus locally annealing the amorphous metals results in locally changing density of the structure, which results in a buckled design, which leads to the bistable behavior. Further, as the density of the material increases, the material becomes stiffer and has an increased resonant frequency.

Figure 1B:
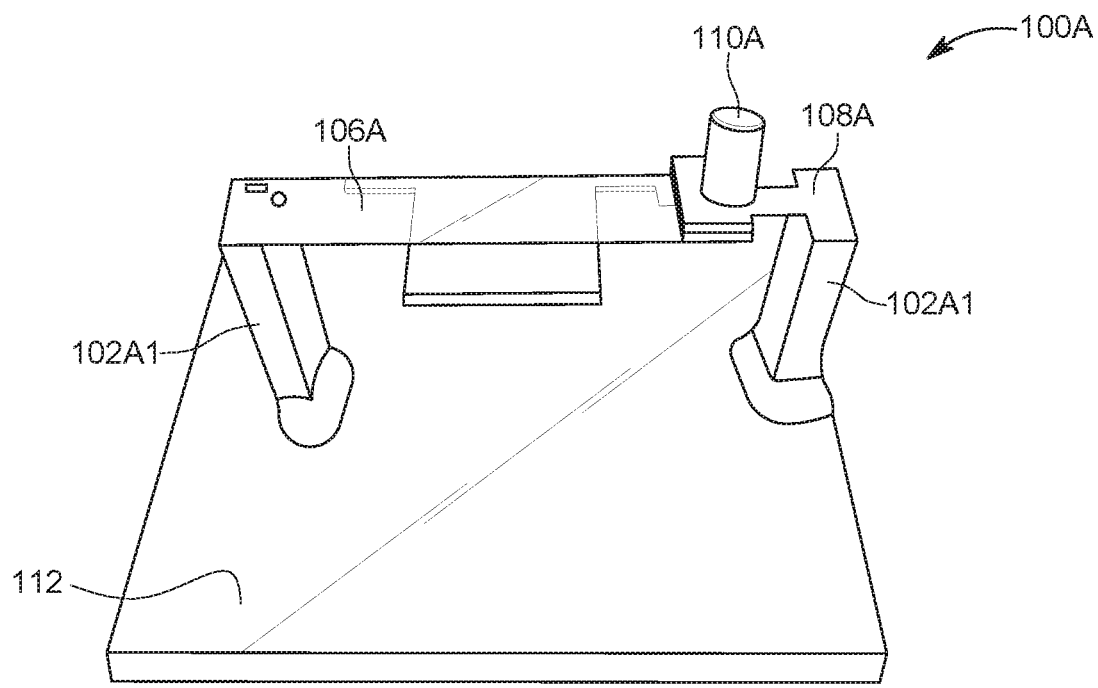
FIG. 1B is a schematic illustration of a perspective view of a macro prototype of a mechanical frequency upconverter according to an embodiment.

FIG. 1B is a schematic illustration of a perspective view of a macro prototype designed based on mechanical frequency upconverter of FIG. 1A. As illustrated, the body 102A comprises two legs 102A1 and 102A2, and the body 102A is open on both sides. Although the body 102A is illustrated as being open on both sides, the cavity can be open or sealed depending upon the application in which the mechanical frequency upconverter is used. In an embodiment, the low-frequency membrane 106A is, for example, a 40 mm×9 mm×0.25 polystyrene membrane and the high-frequency membrane 108A is, for example, a 4 mm×4 mm×25 μm amorphous metal membrane with local crystallization and having a resonance frequency of, for example, 15 kHz. The permanent magnet can be made of, for example, neodymium (NFeB) and can have, for example, a cylindrical shape with a 4 mm diameter and 8 mm length. The permanent magnet can adopt shapes other than a cylindrical shape. The body 102A and the base 112 can be comprised of, for example, Poly(methyl methacrylate) (PMMA) or any other type of material. The main role of the body 102A and base 112 is to support the membranes. The high-frequency membrane 108A can be cut using, for example, a 30 W ytterbium fiber laser with a 1.06 μm wavelength, which forms the local crystallization. This locally induces strains in the high-frequency membrane 108, which stiffens the structure of the high-frequency membrane 108. The low-frequency membrane 106A and the body 102A can be cut using, for example, a 75 W carbon dioxide ($CO_2$) laser with a 10 μm wavelength. The various components can be joined together using, for example, a clear epoxy adhesive.

The mechanical frequency upconverter 100A, with the high-frequency membrane having a bistable design, was subject to testing in air by placing the mechanical frequency upconverter 100A on a shaker and the acoustic pulses were detected by a microphone, for example ½" free-field microphone, coupled to ½" COLD preamplifier, which is coupled to a 100 V/V gain high-gain amplifier, which includes a built-in 20 Hz-20 kHz a bandpass filter. The output of the bandpass filter was coupled to an oscilloscope, which in turn was coupled to a computer running MatLab© for storage and processing. The shaker was oscillated at a 7 Hz oscillation frequency, which is within the range of locomotion frequencies of aquatic animals, and with 0.4 g acceleration. The microphone oriented towards the high-frequency membrane and was placed 10 cm away from the high-frequency membrane. In this setup, the measured voltage at the oscilloscope showed that the oscillatory motion induced by the shaker resulted in peak voltages of 1.4V and a pulse duration of 1.2 ms. Analysis of the frequency domain for the duration of one pulse exhibited a resonant frequency of 15 kHz with an average amplitude of 0.58 V. The equivalent pressure at the surface of the microphone was determined to be 75 dB SPL at 10 cm away from the high-frequency membrane, which is equivalent to 55 dB SPL at one meter.

Figure 1C:
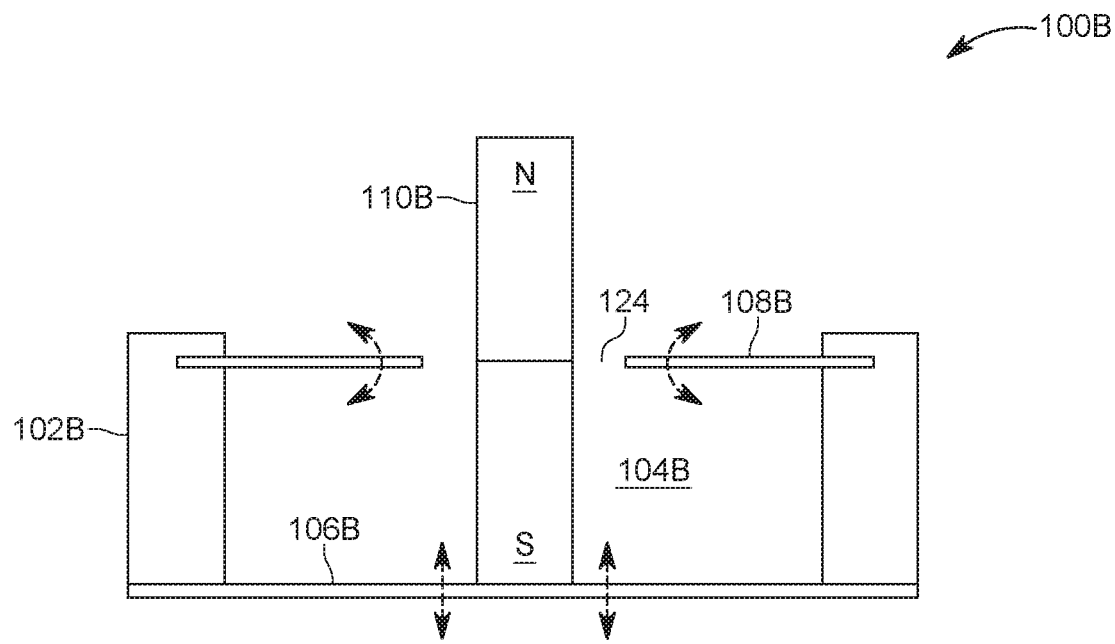
FIG. 1C is a schematic illustration of a side view of a mechanical frequency upconverter according to an embodiment.
Figure 1D:
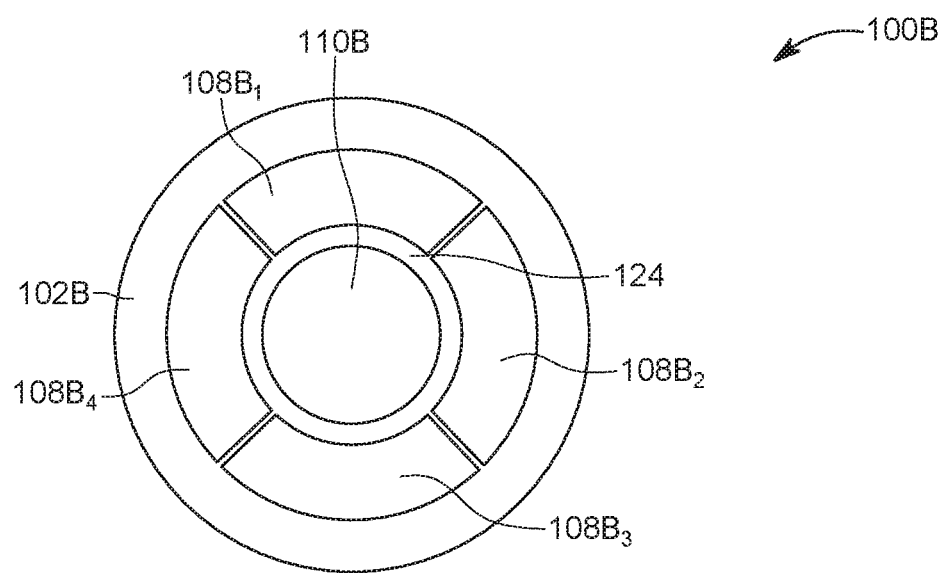
FIG. 1D is a schematic illustration of a top view of a mechanical frequency upconverter according to an embodiment.

FIG. 1C is a schematic illustration of a side view and FIG. 1D is a top view of a mechanical frequency upconverter according to an embodiment. Similar elements in FIGS. 1A, 1C, and 1D are denoted with similar reference numbers. The mechanical frequency upconverter 100B includes a body 102B having a cavity 104B. A low-frequency membrane 106B is coupled to the body 102B and arranged adjacent to the cavity 104B. A high-frequency membrane 108B is coupled to the body 102B and arranged adjacent to the cavity 104B. The high-frequency membrane 108B comprises magnetic metal. As will be appreciated from FIG. 1D, the high-frequency membrane 108B is comprised of a plurality of high-frequency membranes 108B1-108B4. The use of multiple high-frequency membranes boost the output signal because there are multiple high-frequency membranes working together. A permanent magnet 110B is affixed to the low-frequency membrane 106B or the low-frequency membrane 106B is a permanent magnet. Oscillation of the low-frequency membrane 106B at a first frequency causes the permanent magnet 110B to oscillate, which causes the high-frequency membrane 108B to oscillate at a second frequency, which is higher than the first frequency. Specifically, oscillation of the permanent magnet 110B in the vertical direction causes the position of the poles of the permanent magnet 110B to change relative to the high-frequency membrane 108B, which due to the magnetic metal in the high-frequency membrane 108B causes the high-frequency membrane 108B to be alternatingly attracted to the opposite poles, and thus to oscillate. Similar to the embodiment in FIG. 1A, the mechanical frequency upconverter 100B upconverts the low-frequency oscillations of the low-frequency membrane 106B to higher frequency. The particular oscillation frequency of the high-frequency membrane 108B can be selected by suitable selection of the size and materials of the membrane.

In the embodiment illustrated in FIG. 1C, the low-frequency membrane 106B is arranged on a first side of the cavity 104B and the high-frequency membrane 108B is arranged on a second side of the cavity 104B, which is opposite of the first side of the cavity 104B. Further, the permanent magnet 110B is arranged on top of the low-frequency membrane 106B and passes through an opening 124 in the high-frequency membrane 108B. Alternatively, and similar to the embodiment illustrated in FIGS. 1A and 1B, the low-frequency membrane 106B can be a permanent magnet.

As will be appreciated from the top view of the mechanical frequency upconverter 100B illustrated in FIG. 1D, the body 102B, low-frequency membrane 106B, high-frequency membrane 108B, and permanent magnet 110B are cylindrical. However, in other embodiments the body 102B, low-frequency membrane 106B, and high-frequency membrane 108B can have other shapes, such as polygonal shapes.

The materials used for the mechanical frequency upconverter of FIGS. 1C and 1D can be the same as those used for the mechanical frequency upconverter of FIGS. 1A and 1B and the membranes and other materials can be cut using similar techniques. Further, the method of operation mechanical frequency upconverter of FIGS. 1C and 1D is the same as that of the mechanical frequency upconverter of FIGS. 1A and 1B.

The disclosed mechanical frequency upconverters 100A and 100B can be lighter, smaller, and can operate for a very long time compared to conventional acoustic tracking tags because the disclosed mechanical frequency upconverters 100A and 100B do not require an electrical power source (such as a battery that would need to be replaced or recharged) or any electronics. Instead, the movement of the moveable object to which the mechanical frequency upconverter 100A or 100B is attached provides all of the power necessary to produce the high-frequency pulses that are received by acoustic receivers, such as hydrophones. By leveraging this movement as a source of power, the disclosed mechanical frequency upconverters 100A and 100B have a significantly better operational lifetime, which is limited only by the durability of the materials and not by the size of the battery, as in conventional acoustic tracking tags.

Figure 2:
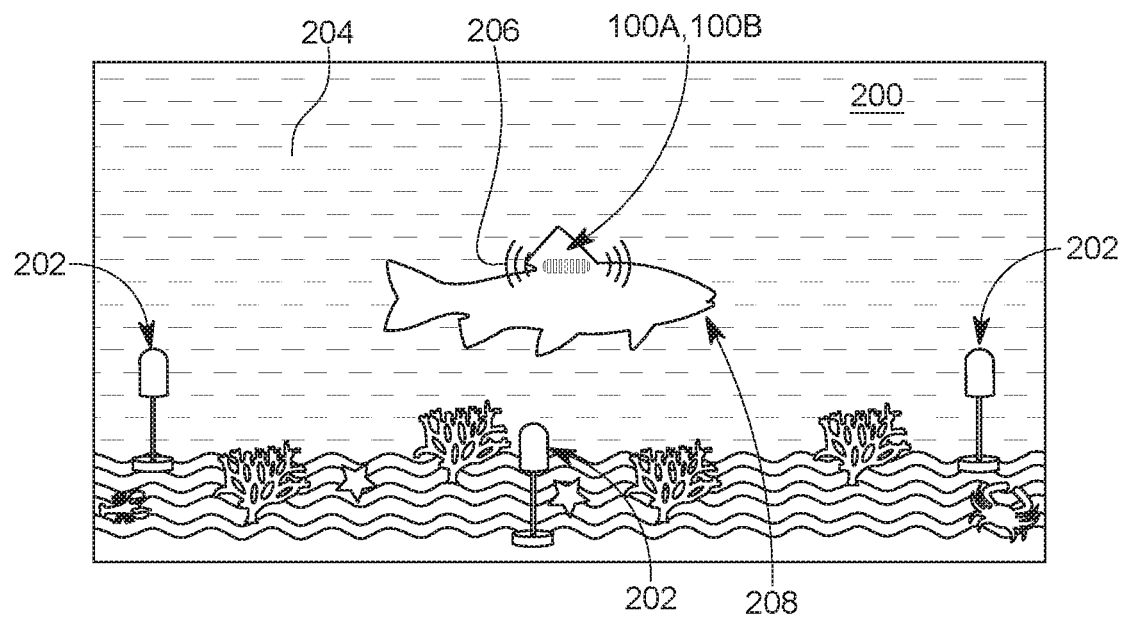
FIG. 2 is a schematic illustration of an acoustic tracking system according to embodiments.

FIG. 2 is a schematic illustration of an acoustic tracking system 200 that can employ the mechanical frequency upconverter as an acoustic tracking tag according to embodiments. The acoustic tracking system includes an acoustic receiver 202 arranged in a liquid 204 and configured to receive acoustic pulses 204 within a predetermined frequency range. Although the illustrated embodiment includes three acoustic receivers 202, the system can be implemented with more or fewer acoustic receivers 202. The system also includes a mechanical frequency upconverter 100A or 100B affixed to a moveable object 208, which in the illustrated embodiment is a fish. The mechanical frequency upconverter 100A or 100B is configured consistent with the description above in connection with FIGS. 1A and 1B or FIGS. 1C and 1D. Oscillation of the high-frequency membrane 108A or 108B generates the acoustic pulses 206 in the liquid 204 at the second frequency, which is within the predetermined frequency range. The use of the disclosed mechanical frequency upconverter in connection with FIG. 2 is but one example of how the mechanical frequency upconverter can be used. The disclosed mechanical frequency upconverter can also be used for indoor tracking, on-land tracking, or as a mechanical frequency upconverter for any number of applications.

Figure 3:
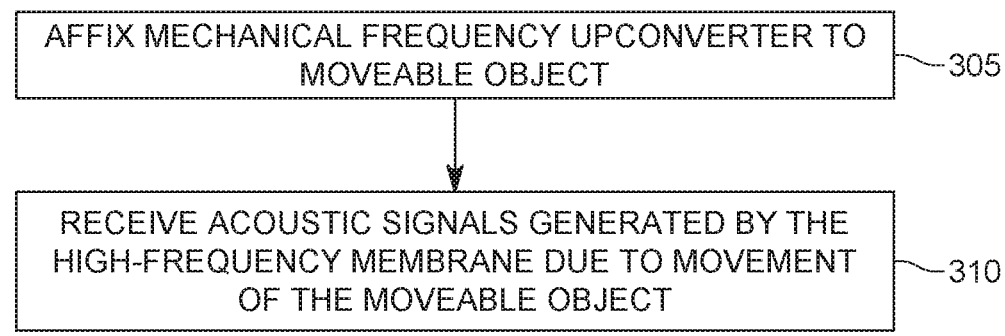
FIG. 3 is a flowchart of a method for acoustic tracking according to embodiments.

FIG. 3 is a flowchart of a method for acoustic tracking according to embodiments. Initially, a mechanical frequency upconverter 100A or 100B is affixed to a moveable object 208 (step 305). The mechanical frequency upconverter 100A or 100B is configured consistent with the description above in connection with FIGS. 1A and 1B or FIGS. 1C and 1D. Next, an acoustic receiver 202 receives acoustic pulses 206 generated by the high-frequency membrane 108A or 108B due to movement of the moveable object 208 (step 310). The movement of the moveable object 208 causes the low-frequency membrane 106A or 106B and the permanent magnet 110A or 110B to oscillate, which induces oscillation in the high-frequency membrane 108A or 108B.

It should be recognized that the use of the terms high-frequency and low-frequency in this disclosure is intended to denote the frequencies relative to each other. Thus, the low-frequency membrane oscillates at a lower frequency than the high-frequency membrane, regardless of the specific oscillation frequencies of the membranes.

The disclosed embodiments provide a mechanical frequency upconverter. It should be understood that this description is not intended to limit the invention. On the contrary, the exemplary embodiments are intended to cover alternatives, modifications and equivalents, which are included in the spirit and scope of the invention as defined by the appended claims. Further, in the detailed description of the exemplary embodiments, numerous specific details are set forth in order to provide a comprehensive understanding of the claimed invention. However, one skilled in the art would understand that various embodiments may be practiced without such specific details.

Although the features and elements of the present exemplary embodiments are described in the embodiments in particular combinations, each feature or element can be used alone without the other features and elements of the embodiments or in various combinations with or without other features and elements disclosed herein.

This written description uses examples of the subject matter disclosed to enable any person skilled in the art to practice the same, including making and using any devices or systems and performing any incorporated methods. The patentable scope of the subject matter is defined by the claims, and may include other examples that occur to those skilled in the art. Such other examples are intended to be within the scope of the claims.

What is claimed is:

1. A mechanical frequency upconverter, comprising:
   a body having a cavity;
   a low-frequency membrane coupled to the body and arranged adjacent to the cavity, wherein the low-frequency membrane is a permanent magnet or a permanent magnet is affixed to the low-frequency membrane; and
   a high-frequency membrane coupled to the body and arranged adjacent to the cavity, wherein the high-frequency membrane comprises a magnetic metal,
   wherein oscillation of the low-frequency membrane at a first frequency causes the high-frequency membrane to oscillate at a second frequency, which is higher than the first frequency, and
   wherein the low-frequency membrane and the high-frequency membrane form one single surface of the cavity.

2. The mechanical frequency upconverter of claim 1, wherein
   the body includes a base on a first side of the cavity,
   a first end of the low-frequency membrane is attached to the body on a second side of the cavity, which is opposite of the first side of the cavity, and a second end of the low-frequency membrane is not attached to the body,
   a first end of the high-frequency membrane is attached to the body on the second side of the cavity and a second end of the high-frequency membrane is not attached to the body,
   the permanent magnet is attached to the second end of the low-frequency membrane.

3. The mechanical frequency upconverter of claim 2, wherein
   the first ends of the low-frequency and high frequency membranes are arranged in a same plane, and
   the second ends of the low-frequency and high-frequency membranes are separated by a gap in the plane.

4. The mechanical frequency upconverter of claim 1, wherein the low-frequency membrane is arranged on a first side of the cavity, and the high-frequency membrane is arranged on a second side of the cavity, which is opposite of the first side of the cavity.

5. The mechanical frequency upconverter of claim 4, wherein
the permanent magnet is arranged on top of the low-frequency membrane and passes through an opening in the high-frequency membrane.

6. The mechanical frequency upconverter of claim 1, wherein the mechanical frequency upconverter does not include an electrical power source.

7. The mechanical frequency upconverter of claim 1, wherein the mechanical frequency upconverter does not include any electronics.

8. The mechanical frequency upconverter of claim 1, wherein the low-frequency membrane comprises a flexible polymer.

9. The mechanical frequency upconverter of claim 1, wherein the magnetic metal of the high-frequency membrane is an amorphous metal.

10. The mechanical frequency upconverter of claim 1, wherein the high-frequency membrane is bistable and the magnetic metal is partially crystallized amorphous metal.

11. An acoustic tracking system, comprising:
an acoustic receiver configured to receive acoustic pulses within a predetermined frequency range; and
a mechanical frequency upconverter affixed to a moveable object and comprising,
a body having a cavity;
a low-frequency membrane coupled to the body and arranged adjacent to the cavity, wherein the low-frequency membrane is a permanent magnet or a permanent magnet is affixed to the low-frequency membrane; and
a high-frequency membrane coupled to the body and arranged adjacent to the cavity, wherein the high-frequency membrane comprises magnetic metal,
wherein oscillation of the low-frequency membrane at a first frequency causes the high-frequency membrane to oscillate at a second frequency, which is higher than the first frequency, and
wherein the low-frequency membrane and the high-frequency membrane form one single surface of the cavity,
wherein oscillation of the high-frequency membrane generates the acoustic pulses at the second frequency, which is within the predetermined frequency range.

12. The acoustic tracking system of claim 11, wherein the acoustic receiver is a hydrophone.

13. The acoustic tracking system of claim 11, wherein
the body includes a base on a first side of the cavity,
a first end of the low-frequency membrane is attached to the body on a second side of the cavity, which is opposite of the first side of the cavity, and a second end of the low-frequency membrane is not attached to the body, a first end of the high-frequency membrane is attached to the body on the second side of the cavity and a second end of the high-frequency membrane is not attached to the body,
the permanent magnet is attached to the second side of the low-frequency membrane.

14. The acoustic tracking system of claim 13, wherein
the second ends of the low-frequency and high frequency membranes are arranged in a same plane, and
the first ends of the low-frequency and high-frequency membranes are separated by a gap in the plane.

15. The acoustic tracking system of claim 11, wherein
the low-frequency membrane is arranged on a first side of the cavity, and
the high-frequency membrane is arranged on a second side of the cavity, which is opposite of the first side of the cavity.

16. The acoustic tracking system of claim 15, wherein
the permanent magnet is arranged on top of the low-frequency membrane and passes through an opening in the high-frequency membrane.

17. A method for acoustic tracking, the method comprising:
affixing a mechanical frequency upconverter to a moveable object, wherein the mechanical frequency upconverter comprises a body having a cavity, a low-frequency membrane coupled to the body and arranged adjacent to the cavity, wherein the low-frequency membrane is a permanent magnet or a permanent magnet is affixed to the low-frequency membrane, a high-frequency membrane coupled to the body and arranged adjacent to the cavity, wherein the high-frequency membrane comprises a magnetic metal, and wherein the low-frequency membrane and the high-frequency membrane form one single surface of the cavity; and
receiving, by an acoustic receiver, acoustic pulses generated by the high-frequency membrane due to movement of the moveable object, wherein the movement of the moveable object causes the low-frequency membrane to oscillate, which induces oscillation in the high-frequency membrane.

18. The method of claim 17, wherein movement of the low-frequency membrane causes the high-frequency membrane to be alternatingly attracted to different poles of the permanent magnet.

19. The method of claim 18, wherein the movement of the low-frequency membrane causes the permanent magnet to pass through an opening in the high-frequency membrane so that a pole of the permanent magnet that is arranged in the cavity in a state when the moveable object is stationary to move through the opening in the high-frequency membrane.

20. The method of claim 18, wherein the movement of the low-frequency membrane adjusts a position of poles of the permanent magnet relative to the high-frequency membrane.

* * * * *